(12) United States Patent
Higashi et al.

(10) Patent No.: US 8,129,739 B2
(45) Date of Patent: Mar. 6, 2012

(54) SEMICONDUCTOR LIGHT EMITTING DEVICE AND SEMICONDUCTOR LIGHT EMITTING DEVICE MOUNTED BOARD

(75) Inventors: Kazushi Higashi, Osaka (JP); Shinji Ishitani, Hyogo (JP)

(73) Assignee: Panasonic Corporation, Osaka (JP)

( * ) Notice: Subject to any disclaimer, the term of this patent is extended or adjusted under 35 U.S.C. 154(b) by 783 days.

(21) Appl. No.: 11/919,558

(22) PCT Filed: Jul. 12, 2006

(86) PCT No.: PCT/JP2006/313851
§ 371 (c)(1),
(2), (4) Date: Oct. 30, 2007

(87) PCT Pub. No.: WO2007/010793
PCT Pub. Date: Jan. 25, 2007

(65) Prior Publication Data
US 2010/0012965 A1 Jan. 21, 2010

(30) Foreign Application Priority Data

Jul. 15, 2005 (JP) .................................. 2005-206421

(51) Int. Cl.
*H01L 33/00* (2010.01)
(52) U.S. Cl. ............ 257/99; 257/98; 257/100; 257/116; 257/117; 257/778; 257/E33.056; 257/E33.057; 257/E33.058; 257/E33.059; 257/E21.503; 438/25; 438/26; 438/108
(58) Field of Classification Search .................... 257/81, 257/82, 91, 98–100, 116, 117, 432–437, 257/E33.056–E33.059, E25.032, 778, E21.503; 438/25–35, 15, 108
See application file for complete search history.

(56) References Cited

U.S. PATENT DOCUMENTS

| | | | |
|---|---|---|---|
| 2001/0024460 A1 | 9/2001 | Yamamoto et al. | |
| 2001/0032985 A1* | 10/2001 | Bhat et al. | 257/88 |
| 2003/0107053 A1 | 6/2003 | Uemura et al. | |
| 2004/0061123 A1* | 4/2004 | Shelton et al. | 257/99 |
| 2005/0127374 A1* | 6/2005 | Lin et al. | 257/79 |
| 2005/0133807 A1* | 6/2005 | Park et al. | 257/99 |

(Continued)

FOREIGN PATENT DOCUMENTS

JP 4-239185 8/1992
(Continued)

OTHER PUBLICATIONS

Patent Cooperation Treaty (PCT) International Preliminary Report on Patentability, issued Jan. 16, 2008.

(Continued)

*Primary Examiner* — Benjamin Sandvik
*Assistant Examiner* — Farid Khan
(74) *Attorney, Agent, or Firm* — Wenderoth, Lind & Ponack, L.L.P.

(57) ABSTRACT

In a semiconductor light emitting device having a matrix of a plurality of bumps composed of one n-bump formed on an n-electrode layer and of a large number of p-bumps formed on p-electrode layers, the occurrence of a faulty junction after mounting can be suppressed by placement of the n-bump at center of the bump array, because the position at the center is most resistant to occurrence of stress after the mounting. Employment of such a configuration of bump array increases reliability of mounting thereof while improving uniformity of light emission intensity in the semiconductor light emitting device having an increased size.

13 Claims, 7 Drawing Sheets

U.S. PATENT DOCUMENTS

2007/0096130 A1* 5/2007 Schiaffino et al. .............. 257/98

FOREIGN PATENT DOCUMENTS

| JP | 9-008360 | 1/1997 |
|----|----------|--------|
| JP | 10-294493 | 11/1998 |
| JP | 11-097827 | 4/1999 |
| JP | 11-163396 | 6/1999 |
| JP | 11-204830 | 7/1999 |
| JP | 2001-245480 | 12/2001 |
| JP | 2002-057374 | 2/2002 |
| JP | 2003-008083 | 1/2003 |
| JP | 2003-243757 | 8/2003 |
| JP | 2004-079972 | 3/2004 |
| JP | 2005-183910 | 7/2005 |
| JP | 2006-093632 | 4/2006 |
| JP | 2006-128457 | 5/2006 |

OTHER PUBLICATIONS

International Search Report issued Aug. 8, 2006 in the International (PCT) Application of which the present application is the U.S. National Stage.

* cited by examiner

SEMICONDUCTOR LIGHT EMITTING DEVICE AND SEMICONDUCTOR LIGHT EMITTING DEVICE MOUNTED BOARD

TECHNICAL FIELD

The present invention relates to a semiconductor light emitting device that mounts with flip-chip bonding on a circuit board, and also relates to a circuit board mounted with the semiconductor light emitting device.

BACKGROUND ART

In recent years, a technique for mounting a large number of bare chips on a circuit board has been used. The bare chips are composed of semiconductor light emitting devices typified by light emitting diode (which will be referred to as "LED" hereinbelow). By such a technique, a lighting device, and a display device or the like are manufactured. There are used LED bare chips (which will be referred to as "LED chips" hereinbelow) 0.3 mm square, for example, which are mounted with high density in specified areas on the board.

Hereinbelow, a principal structure of such a conventional LED chip will be described with reference to drawings depicted in FIG. 11A and FIG. 11B. FIG. 11B is a schematic bottom view of an LED chip 501 and FIG. 11A shows a schematic structure of a section along line B-B in FIG. 11B.

As shown in FIG. 11A and FIG. 11B, the conventional LED chip 501 has an optically transparent device board 511 having a rectangular shape, e.g., about 0.3 mm square, an n-type semiconductor layer 521 that is formed so as to cover a lower surface of the device board 511 in FIG. 11A, a p-type semiconductor layer 522 that is formed on a surface of the n-type semiconductor layer 521 and that effects light emission between the n-type semiconductor layer 521 and the p-type semiconductor layer 522, an n-electrode layer 531 that is a thin film formed on the n-type semiconductor layer 521, and a p-electrode layer 532 that is a thin film formed on the p-type semiconductor layer. On each of the electrode layers 531, 532 are formed bumps for electrical connection to a circuit board not shown. The LED chip 501 having such a configuration functions as so-called "blue LED chip" and is characterized in that an area of the n-electrode layer 531 is smaller than that of the p-electrode layer 532. As shown in FIG. 11B, accordingly, the electrode layers have different numbers of bumps formed thereon, for example, one n-bump 541 is formed on the n-electrode layer 531 and two p-bumps 542 are formed on the p-electrode layer 532.

The conventional LED chip 501 having such a configuration is mounted on the circuit board, e.g., by means of flip-chip mounting or the like, so that the bumps 541, 542 are electrically connected to electrode pads formed on the circuit board not shown, and the LED chip 501 emits light when energized from the circuit board.

In order to improve functions and characteristics of such an LED chip, various techniques have been disclosed, for example, for uniform light emission from the LED chip.

In Patent Document 1, for example, is disclosed a technique in which a p-electrode and an n-electrode formed on a front surface and a back surface, respectively, of a light emitting diode element are partitioned into a plurality of regions, in which the n-electrodes on the back surface are connected to a circuit board by die bonding, and in which the p-electrodes on the front surface are connected to a line pattern by wire bonding, whereby uniformity of distribution of currents flowing in the light emitting diode element may be improved.

In Patent Document 2 is disclosed a technique in which a comb-shaped p-type semiconductor layer is formed by diffusion on an upper surface of an n-type semiconductor layer, and in which a junction end part between the n-type semiconductor layer and the p-type semiconductor layer (i.e., an edge of a junction surface between both the semiconductor layers) is provided with a plurality of turns on a surface of an LED chip, whereby uniformity of light output distribution as a whole light emitting surface may be achieved.

In Patent Document 3 is disclosed a technique in which an n-electrode and a p-electrode are formed on a lower surface of an LED chip, and in which the electrodes are joined to a circuit board through an anisotropic conductive member. Thus light from the LED is emitted without being interrupted by the electrodes or the like on an upper surface of the LED chip, and brightness of the LED chip is thereby improved.

[Patent Document 1] Japanese unexamined patent application publication No. H11-163396 A
[Patent Document 2] Japanese unexamined patent application publication No. H04-239185 A
[Patent Document 3] Japanese unexamined patent application publication No. H09-008360 A

DISCLOSURE OF INVENTION

Problems to be Solved by the Invention

In recent years, development of large-size LED chips (e.g., 1 mm square or larger) has been progressing. As for such increase in size of LED chips, it is necessary to achieve uniform current distribution by increase in the number of bumps formed on an n-electrode and a p-electrode formed on a lower surface of an LED chip in accordance with a size of the chip, in order to ensure uniformity of light emission intensities of the chip.

Conventionally, there are no ideas as to how an increased number of bumps should be positioned with such increase in the size of LED chips. With the increase in number of bumps, in particular, there is an increased possibility that bumps having faulty connections might be included in one LED chip, and thus ideas are required for ensuring reliability of LED chip mounting.

Therefore, it is an object of the invention to resolve problems described above and to provide a large-size semiconductor light emitting device of which uniformity of light emission intensities, reliability of mounting, and the like can be ensured and to provide a circuit board mounted with the semiconductor light emitting device.

Means for solving the Subject

In order to achieve the object, the invention is configured as follows.

According to a first aspect of the present invention, there is provided a semiconductor light emitting device comprising:
 an optically transparent device board;
 a first semiconductor layer which is formed on the device board so as to cover the device board and which is one of a p-type semiconductor layer and an n-type semiconductor layer;
 a first electrode layer formed on the first semiconductor layer;
 a second semiconductor layer which is the other of the semiconductor layers, which is formed on an area except an area where the first electrode layer is formed on the first semiconductor layer, and for emitting light between the first semiconductor layer and the second semiconductor layer;

a second electrode layer formed on the second semiconductor layer;

a first bump formed on the first electrode layer; and a plurality of second bumps formed on the second electrode layer, wherein the first electrode layer is formed so that the first bump is placed in a position that is nearer to center of a bump arrangement of the first bump and of the second bumps than the second bumps placed in positions most distant from the center of the bump arrangement.

According to a second aspect of the present invention, there is provided a semiconductor light emitting device as defined in the first aspect, wherein the second bumps are formed in plurality of rows, and the first bump is placed inside the second bumps placed in outmost periphery of the rows.

According to a third aspect of the present invention, there is provided a semiconductor light emitting device as defined in the first aspect, wherein the first bump is placed at the center of the bump arrangement.

According to a fourth aspect of the present invention, there is provided a semiconductor light emitting device as defined in the first aspect, further comprising another first bump formed on the first electrode layer, wherein said another first bump is placed in a position that is nearer to the center of the bump arrangement than the second bumps most distant from the center of the bump arrangement.

According to a fifth aspect of the present invention, there is provided a semiconductor light emitting device as defined in the first aspect, wherein the first bump and the second bumps are formed in an identical shape and in an identical size and wherein the bumps are placed so as to form a grid-like array.

According to a sixth aspect of the present invention, there is provided a semiconductor light emitting device as defined in the first aspect, wherein a plurality of the second semiconductor layers independent from one another are formed on the area on the first semiconductor layer except the area where the first electrode layer is formed, and the second electrode layers having the second bumps thereon are respectively formed on the second semiconductor layers.

According to a seventh aspect of the present invention, there is provided a semiconductor light emitting device comprising:

a generally rectangular device board having optical transparency;

a first semiconductor layer which is formed on the device board so as to cover the device board and which is one of a p-type semiconductor layer and an n-type semiconductor layer;

a first electrode layer formed on the first semiconductor layer;

a second semiconductor layer which is the other of the semiconductor layers, which is formed on an area on the first semiconductor layer except an area where the first electrode layer is formed, and for emitting light between the first semiconductor layer and the second semiconductor layer;

a second electrode layer formed on the second semiconductor layer;

a first bump formed on the first electrode layer; and a plurality of second bumps formed on the second electrode layer, wherein the first bump and the second bumps are formed a grid-like bump array, the second semiconductor layer and the second electrode layer are formed so that bumps placed in corner parts in the grid-like bump array are the second bumps.

According to an eighth aspect of the present invention, there is provided a semiconductor light emitting device as defined in the seventh aspect, further comprising another first bump formed on the first electrode layer, wherein the first bump and said another first bump are placed inside outmost peripheral rows in the grid-like bump array.

According to a ninth aspect of the present invention, there is provided a semiconductor light emitting device as defined in the seventh aspect, wherein the first bump and the second bumps are formed in an identical shape and in an identical size.

According to a tenth aspect of the present invention, there is provided a semiconductor light emitting device as defined in the seventh aspect, wherein a plurality of the second electrode layers that individually correspond to the second bumps are formed on the area on the first semiconductor layer except the area where the first electrode layer is formed, and the second electrode layers on corner sides on which the second bumps placed in the corner parts are formed, are electrically connected to the second electrode layers on adjacent sides on which the second bumps adjacent to the second bumps on the corner sides are formed.

According to an eleventh aspect of the present invention, there is provided a semiconductor light emitting device as defined in any one of the first through tenth aspects, wherein the first electrode layer comprising:

a bump formation part on which the first bump is formed; and a strip part which is placed so as to extend from the bump formation part, between the second bumps, toward edges of the first semiconductor layer without contact with the second semiconductor layers and the second electrode layers.

According to a twelfth aspect of the present invention, there is provided a semiconductor light emitting device mounted board comprising:

the semiconductor light emitting device as defined in any one of the first through tenth aspects, and a circuit board on which a first electrode part to be electrically connected to the first bump on the semiconductor light emitting device and a plurality of second electrode parts to be electrically connected to the second bumps are formed and arranged corresponding to the arrangement of the bumps and on which the semiconductor light emitting device is mounted so that the bumps and the electrode parts are electrically connected to each other.

Effects of the Invention

In the invention, a large number of the second bumps are provided more than the first bumps with increase in size of semiconductor light emitting device, so that uniformity of current distribution can be achieved and so that uniformity of light emission intensities can be improved. Besides, the first bumps smaller in number than the second bumps are placed in the positions that are nearer to the center of the bump array than the second bumps most distant from the center of the bump array, and stresses caused in the first bumps can thereby be made lower than stresses caused in the most distant second bumps, during or after the mounting. Thus occurrence of faulty junctions in the fewer first bumps can be suppressed and reliability of the mounting of the semiconductor light emitting device can be improved. Consequently, there can concretely be provided a large-size semiconductor light emitting device by which reliability of mounting thereof can be increased while uniformity of light emission intensities is improved.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
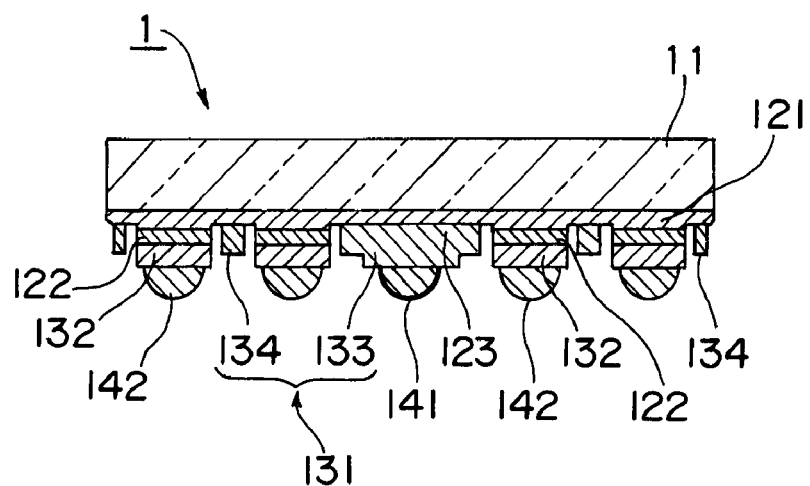
FIG. 1 is a schematic section of an LED chip in accordance with a first embodiment of the invention.

Before the description of the present invention proceeds, it is to be noted that like parts are designated by like reference numerals throughout the accompanying drawings.

Hereinbelow, embodiments of the present invention will be described in detail with reference to the accompanying drawings.

First Embodiment

Figure 2:
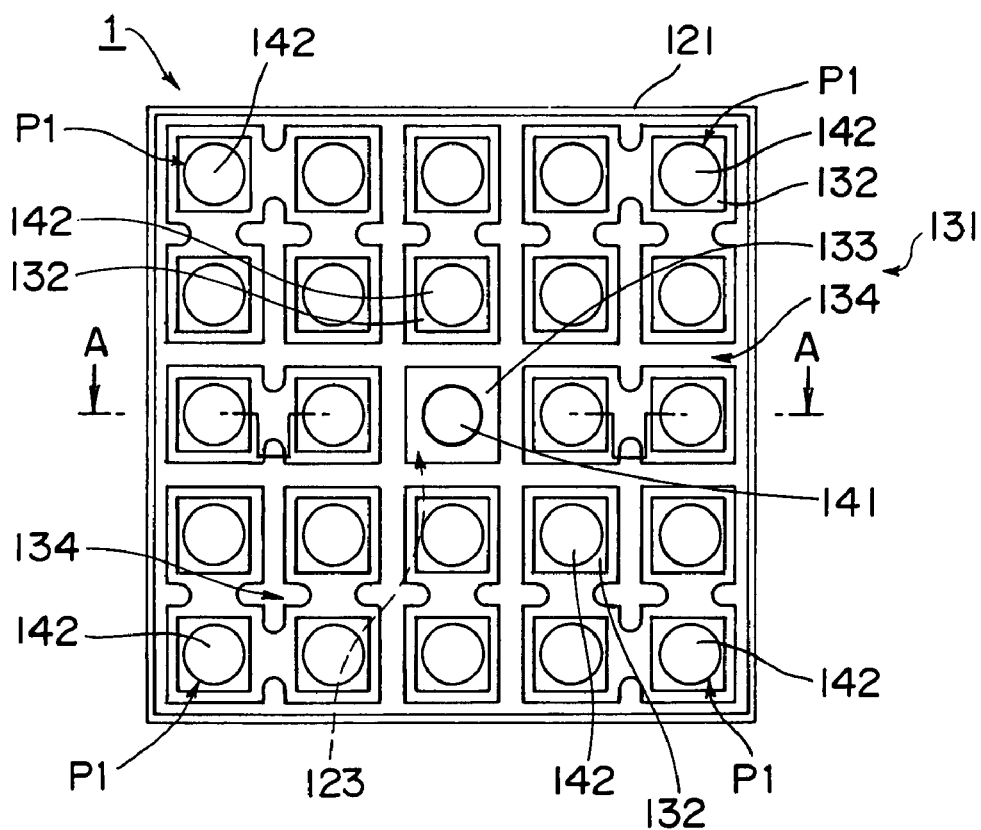
FIG. 2 is a schematic bottom view of the LED chip in accordance with the first embodiment.

FIG. 1 is a schematic vertical section showing a chip-like semiconductor light emitting device 1 having a light emitting diode (which element will be referred to as "LED chip" hereinbelow) in accordance with a first embodiment of the invention. FIG. 2 is a schematic bottom view of the LED chip 1. FIG. 1 shows the section taken along line A-A in the LED chip 1 shown in FIG. 2.

As shown in FIG. 1 and FIG. 2, the LED chip 1 has an optically transparent substrate 11 (a substrate for chip itself, which substrate will be referred to as "device board" hereinbelow) having a rectangular shape, e.g., about 1 mm square and formed of sapphire, an n-type semiconductor layer 121 as an example of first semiconductor layer formed so as to cover a whole lower surface of the device board 11 in FIG. 1, p-type semiconductor layers 122 as an example of second semiconductor layer that are formed on the n-type semiconductor layer 121 and that effect light emission between the n-type semiconductor layer 121 and the p-type semiconductor layers 122, an n-electrode layer 131 (part designated by reference numerals 133, 134) as an example of first electrode layer that is a thin film formed on the n-type semiconductor layer 121, and p-electrode layers 132 as an example of second electrode layer that are thin films formed on the p-type semiconductor layers 122. In FIG. 1 and FIG. 2, only principal structure of the LED chip 1 is shown and other significantly thin layers or films are provided on interfaces of the semiconductor layers and the electrode layers of the LED chip 1, as necessary.

The p-type semiconductor layers 122 are formed on areas on the n-type semiconductor layer 121 except a specified electrode area 123 (i.e., an area where the first electrode layer is formed), and the n-electrode layer 131 is formed on the electrode area 123 of the n-type semiconductor layer 121. The n-electrode layer 131 has a generally rectangular area 133 that is positioned generally at center of the n-type semiconductor layer 121 and a reticular strip part (or a linear part) 134 extending in an area between the p-electrode layers 132 from the area 133.

The LED chip 1 further includes one n-bump 141 as an example of first bump formed on the area 133 of the n-electrode layer 131 (the area 133 of the n-electrode layer 131 will be referred to as "bump formation part 133" hereinbelow) and a plurality of (preferably not less than three, for example, twenty-four in the embodiment) p-bumps 142 as an example of second bump formed on the p-electrode layers 132 around the area 133. In FIG. 1 and FIG. 2, the n-bump 141 is depicted with use of a thick line in distinction from the p-bumps 142 (ditto for FIGS. 5, 6, 7, 9, and 10).

As shown in FIG. 2, the n-bump 141 and the plurality of p-bumps 142 are arranged on a lower surface of the LED chip 1 having the generally rectangular shape so as to form a rectangle having each side composed of five bumps, that is, a five-by-five matrix, and the n-bump 141 is placed at center of the matrix of the twenty-five bumps (which will be referred to simply as "bump array (or bump arrangement)"). The center of the bump array implies a center of gravity of the plurality of bumps, i.e., a group of the five-by-five bumps assumed as one body. The bump array has four corner parts P1 in positions farthest from its center, and a p-bump 142 is placed in each of the four corner parts P1. The strip part 134 of the n-electrode layer 131 is placed so as to extend from the bump formation part 133 positioned generally at the center of the n-type semiconductor layer 121, through the area between the plurality of p-bumps 142, toward outer peripheral edges of the n-type semiconductor layer 121 and so as to extend along whole periphery of the n-type semiconductor layer 121. Though the strip part 134 is thus placed so as to extend through the area between the p-bumps 142, specified clearances for preventing electrical conduction to the p-bumps 142 and the p-electrode layers 132 are ensured.

For mounting of the LED chip 1 on the circuit board, the lower surface of the LED chip on which the n-bump 141 and the p-bumps 142 have been formed is made to face a principal surface of the circuit board, that is, the surface on which electrodes to be electrically connected to the LED chip 1 have been formed, and the LED chip 1 is then pressed against the circuit board while ultrasonic vibrations (or heat) are applied to the LED chip, so that the bumps have metal junctions and electrical connections with the electrodes on the circuit board (i.e., undergo flip-chip mounting on the circuit board). Instead of being directly connected to each other, the bumps on the LED chips and the electrodes on the circuit board may indirectly be connected through conductive material or the like. For example, the flip-chip mounting may be performed with anisotropic conductive resin interposed between the bumps and the electrodes.

The LED chip 1 of the first embodiment having such a configuration can be manufactured with use of a common semiconductor manufacture process. For instance, various layers (films) using desired materials and having desired thicknesses and sizes can sequentially be formed on the device board 11 by repetition of a film forming process, an epitaxial growth process, a photolithography process, an etching process, and a resist film removal process, and the LED chip 1 is consequently manufactured.

The LED chip 1 of the first embodiment having such a configuration can be configured, e.g., with use of such materials as follows. A sapphire board 80 μm thick is used as the device board 11, n-GaN is used as the n-type semiconductor layer 121 and is formed so as to have a thickness of 5 μm, and the p-type semiconductor layer 122 having a thickness of 5 μm and composed of a plurality of layers of GaN-p, AlGaN-p, InGaN, GaN, and AlGaN-n is formed on the surface of the semiconductor layer 121. For the n-electrode layer 131, an Au layer is formed on a surface of a plurality of layers formed of Ti, Al, and vanadium V, so that the electrode layer on the order of 2 μm in thickness is formed. For the p-electrode layer 132, an Au layer is formed on a surface of a plurality of layers formed of Ti and Rh, so that the electrode layer on the order of 1.5 μm in thickness is formed. On the surfaces of the electrode layers, the bumps are formed of conductive materials such as Au and solder. The LED chip 1 configured in such a manner has a dimension of 1 mm by 1 mm in plan and a thickness on the order of 90 μm, for example. Each of the p-type semiconductor layers 122 and the p-electrode layers 132 is formed in shape of about 120 to 130 μm square, for instance.

In the flip-chip mounting of the LED chip, the circuit board undergoes elastic deformation due to the pressure, heat or the like in the mounting and, after the mounting, stresses are caused in junctions between the bumps and the electrodes on the circuit board by the elastic deformation of the circuit board (i.e., because the circuit board recovers an initial shape). On condition that the LED chip has been joined to the circuit board with the plurality of bumps, the stresses caused in the junctions after the mounting are larger in the junctions positioned far from the center of the bump array than in the center and the stresses may cause breaks in the metal junctions between the bumps on the LED chip and the electrodes on the circuit board and thus may cause faulty junctions (so-called open defect).

In the LED chip 1 shown in FIG. 1 and FIG. 2, the n-bump 141 is placed at the center of the bump array, so that the stress in the junction between the circuit board and the n-bump 141 after the mounting is smaller than the stresses in surroundings thereof (i.e., the junctions between the circuit board and the p-bumps 142). In the LED chip 1, occurrence of the faulty junction (i.e., open defect) in the n-bump 141 after the mounting can be suppressed by the placement of the n-bump 141 at the center of the bump array that is most resistant to the occurrence of the stress after the mounting (or that minimizes the stress if the stress occurs). Thus reliability of the LED chip 1 can be increased by the suppression of the faulty junction in the n-bump 141 fewer than the p-bumps 142, after the mounting.

Hereinbelow, such effects of the LED chip 1 of the first embodiment will be described specifically with use of drawings, in comparison with an LED chip 301 that is a comparative example with respect to the first embodiment.

Figure 3A:
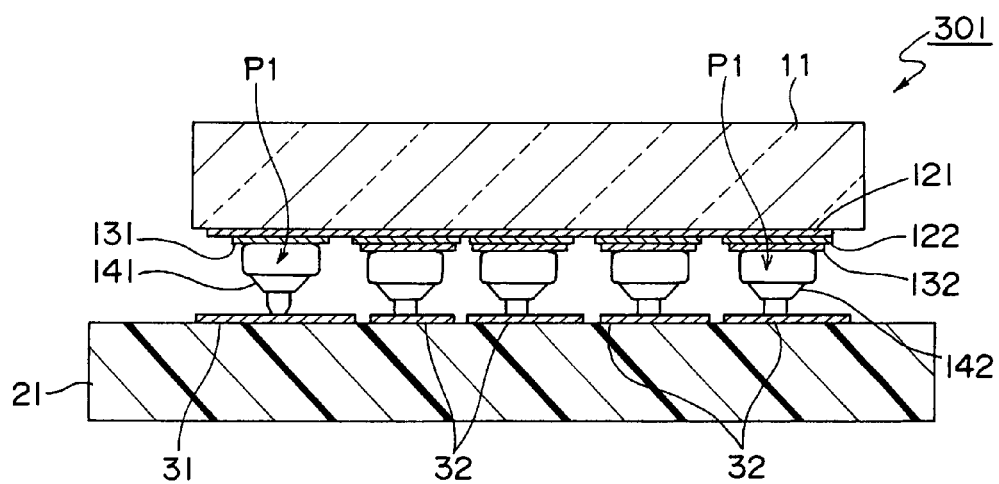
FIG. 3A is a schematic section illustrating a state in which an LED chip that is a comparative example relating to the LED chip of the first embodiment has been mounted on a circuit board.

Initially, in FIG. 3A is shown a schematic section illustrating a principal configuration of the LED chip 301 of the comparative example. In the LED chip 301 of the comparative example, as shown in FIG. 3A, an arrangement of an n-electrode layer 131, p-electrode layers 132, an n-bump 141, and p-bumps 142 is configured so as to be different from that in the LED chip 1 of the first embodiment. The LED chip 1 and the LED chip 301 are different only in the arrangement of component members, and description of the same component members designated by the same reference numerals is therefore omitted in order to facilitate understanding of the specification.

Figure 3B:
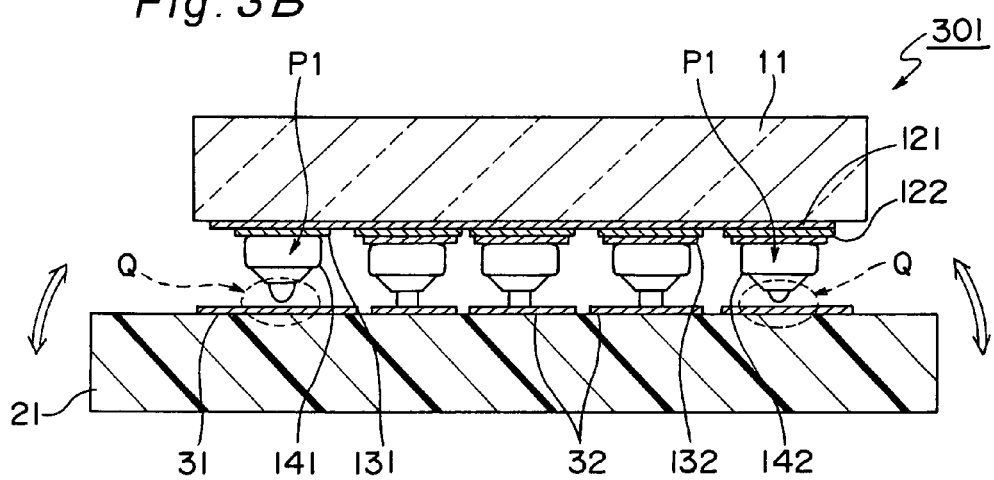
FIG. 3B is a schematic section illustrating a state in which faulty junctions have occurred in bumps placed in corner parts of the LED chip of the comparative example of FIG. 3A.

As shown in FIG. 3A, the LED chip 301 of the comparative example has an n-type semiconductor layer 121, p-type semiconductor layers 122, the n-electrode layer 131, the p-electrode layers 132, the one n-bump 141, and the plurality of p-bumps 142 on a lower surface thereof in the drawing. The LED chip 301 is mounted on a circuit board 21 so that the n-bump 141 and the p-bumps 142 are electrically connected to electrodes 31 and 32 formed corresponding to the arrangement of the bumps. The only one n-bump 141 is placed in a corner part P1 of a bump array, as shown in FIG. 3A. In the LED chip of the comparative example having such a configuration, as described above, the circuit board 21 undergoes elastic deformation due to pressure, heat or the like in the mounting and, after the mounting, stresses are caused in junctions between the bumps and the electrodes on the circuit board because of recovery of an initial shape of the circuit board or the like. The stresses increase with approach to periphery of the LED chip 301, so that break might be caused in the metal junction between the n-bump 141 placed in the corner part P1 (on left side in the drawing) as shown in FIG. 3B and the electrode 31 on the circuit board 21, resulting in faulty junction (at a site shown by character Q in FIG. 3B). There also might be caused break and faulty junction in the metal junction between the p-bump 142 placed in a corner part P1 on the other side (on right side in the drawing) and the electrode 32 on the circuit board 21. As long as a bump having such faulty junction is the one p-bump 142 out of the plurality of bumps, if the faulty junction is caused, great degradation in function of the LED chip 301 as a whole rarely occurs because connections of the other p-bumps 142 are maintained. In the case that a bump having the faulty junction is the only one n-bump 141 in the LED chip 301, however, the faulty junction caused in the n-bump 141 leads directly to faulty function of the LED chip 301. In such a case, reliability of the mounting of the LED chip having an increased size greatly decreases.

Figure 4A:
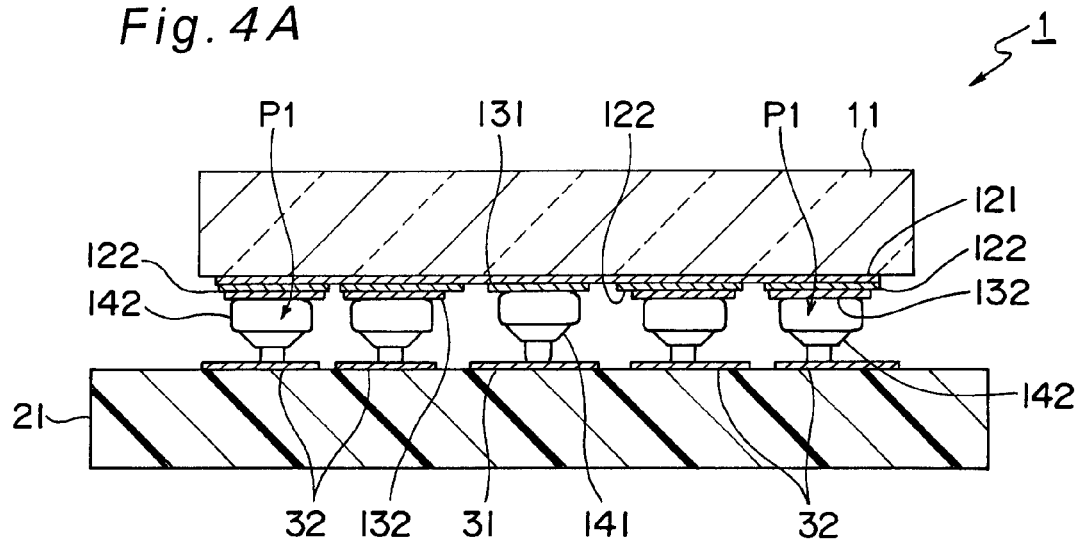
FIG. 4A is a schematic section illustrating a state in which the LED chip of FIG. 1 has been mounted on a circuit board.
Figure 4B:
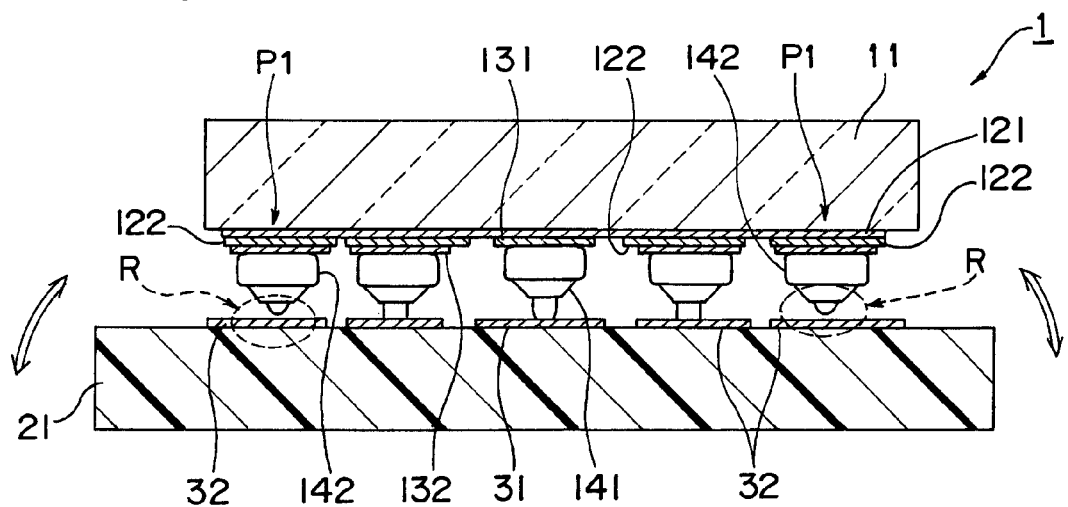
FIG. 4B is a schematic section illustrating a state in which faulty junctions have occurred in bumps placed in corner parts of the LED chip of FIG. 4A.

In the LED chip 1 of the first embodiment as shown in FIG. 4A, by contrast, the p-bumps 142 are placed in the corner parts P1 of the bump array, and the n-bump 141 is placed at the center of the bump array. Even if a break in the metal junction between the p-bump 142 placed in a corner part P1 and the electrode 32 on the circuit board 21 causes faulty junction (at a site shown by character R in FIG. 4B), e.g., as shown in FIG. 4B, great degradation in function of the LED chip 301 as a whole is prevented because connections between the other p-bumps 142 and the electrodes 32 are maintained. Besides, the n-bump 141 is placed at the center of the bump array that is most resistant to occurrence of stress, so that the metal junction between the n-bump 141 and the electrode 31 on the circuit board 21 resists being broken on condition that deformation of the circuit board 21 or the like occurs. As a result, the reliability of the mounting of the LED chip 1 having an increased size can be increased by decision of the placement of the bumps such that the comparatively few n-bump 141 is placed at the center of the bump array as in the LED chip 1 of the first embodiment.

In the LED chip 1, application of currents between the n-electrode layer 131 and the p-electrode layers 132 through the n-bump 141 and the plurality of p-bumps 142 from the circuit board causes occurrence of light between the n-type semiconductor layer 121 and the p-type semiconductor layers 122, and the light having occurred is emitted through the optically transparent device board 11 toward above and sides in FIG. 1. In the LED chip 1, distribution of current densities between those layers influences distribution of light emission intensities.

In the LED chip 1, therefore, uniformity of the distribution of current densities between the n-electrode layer 131 and the p-electrode layers 132 can be improved because the strip part 134 of the n-electrode layer 131 extends from the bump formation part 133 positioned on the center of the n-type semiconductor layer 121 toward the periphery of the n-type semiconductor layer 121 and surrounds part (or all) of areas of the p-electrode layer 132 on which the p-bumps 142 are formed, as shown in FIG. 2. As a result, uniformity of the distribution of light emission intensities between the n-type semiconductor layer 121 and the p-type semiconductor layers 122 can be improved. Though it is thought that simple scale-up of an LED chip having the conventional configuration results in inhomogeneous distribution of light emission intensities thereof because increase in size of an LED chip tends to cause increase in ratio of an area the p-electrode layers 132 occupy to an area of the n-electrode layer 131, in particular, uniformity of distribution of light emission intensities in an LED chip having an increased size can be improved by contrivance of the placement of the strip part 134 as in the LED chip 1 of the first embodiment. It is particularly preferable for uniform light emission intensity that the placement and configuration of the strip part 134 is symmetrical with respect to the center of the LED chip 1, as shown in FIG. 2. The placement and configuration of the first embodiment in which the n-bump 141 is placed at the center of the bump array and in which the p-bumps 142 are placed with respect to the center are suitable for achievement of uniform light emission intensity in the LED chip 1.

Hereinbelow, modifications of the LED chip of the first embodiment will be described.

(First Modification)

Figure 5:
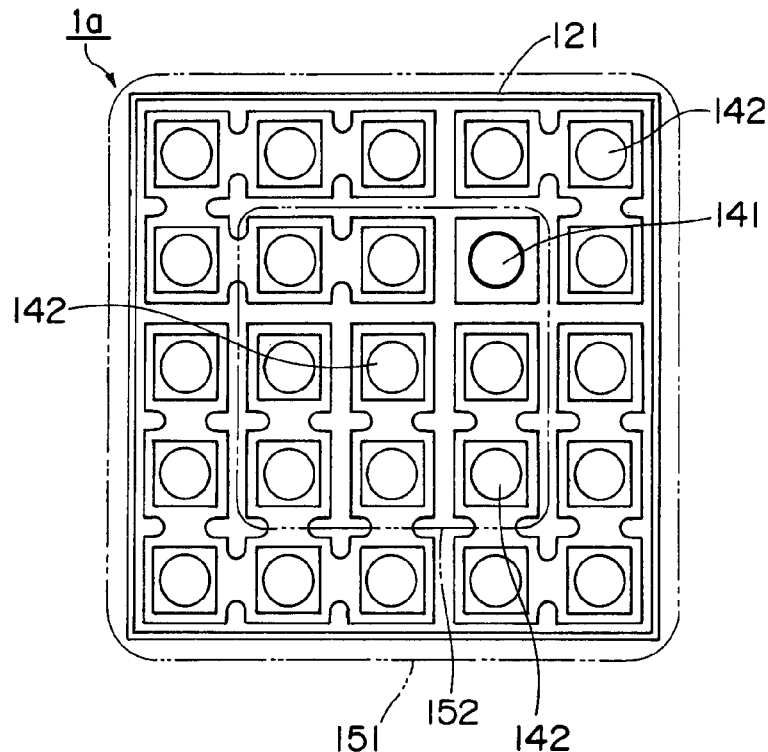
FIG. 5 is a schematic bottom view of an LED chip in accordance with a first modification of the first embodiment.

In terms of the suppression of faulty junction in the n-bump 141 after the mounting, the n-bump 141 does not necessarily have to be placed at the center of the bump array and has only to be placed inside a group of bumps positioned on outmost periphery of the bump array (sixteen p-bumps 142 positioned in an area bordered by two-dot chain lines 151, 152 in FIG. 5), for example, as in an LED chip 1a of a first modification shown in a bottom view of FIG. 5. In the LED chip 1a, the n-bump 141 is spaced apart inward from an edge of an n-type semiconductor layer 121 nearest thereto, by a distance larger than a diameter of the n-bump 141. It is hardly thought that all metal junctions in the group of bumps positioned on the outmost periphery might be broken, and thus bumps where metal junctions between the bumps and the electrodes are maintained exist in the outmost group of bumps, so that junctions between the bumps positioned in an area inside the group and the electrodes can be protected and so that occurrence of faulty junction in the n-bump 141 can be suppressed. In the first modification, the n-bump can be placed in an area enclosed by the two-dot chain line 152 in FIG. 5.

(Second Modification)

Figure 6:
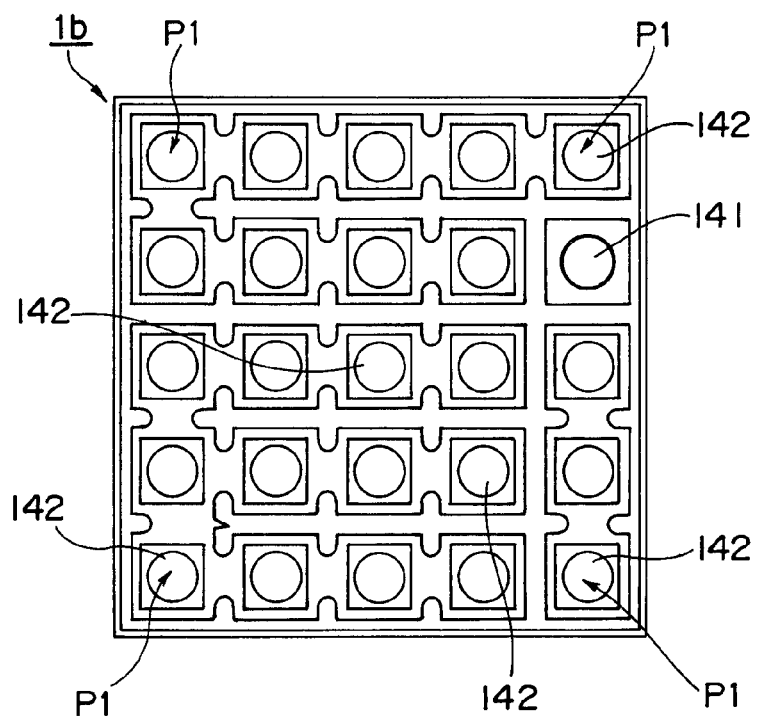
FIG. 6 is a schematic bottom view of an LED chip in accordance with a second modification of the first embodiment.

In FIG. 6 is shown a schematic bottom view of an LED chip 1b that is a second modification of the first embodiment. As in the LED chip 1b of the second modification shown in FIG. 6, an n-bump 141 may be placed in positions except four corner parts P1 in outmost periphery of a bump array. Such placement of the n-bump 141 in a position that is nearer to center of the bump array than p-bumps 142 farthest from the center of the bump array (i.e., four p-bumps 142 placed in the four corner parts P1) reduces a stress caused in a junction between the n-bump 141 and a circuit board and suppresses occurrence of faulty junction in the n-bump 141 after the mounting, in comparison with placement of the n-bump in positions farthest from the center of the bump array (i.e., the corner parts). In the second modification, the n-bump can be placed in an area except the four corner parts in the bump array.

Figure 7:
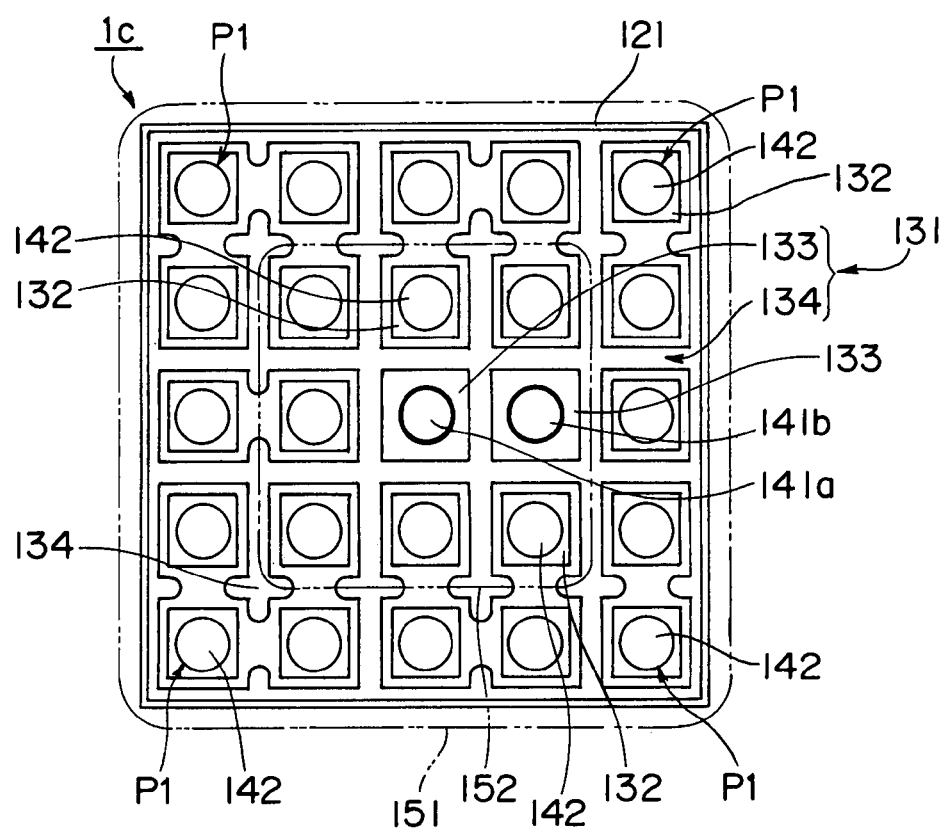
FIG. 7 is a schematic bottom view of an LED chip in accordance with a second embodiment of the invention.

In terms of more reliable suppression of the faulty junction in the n-bump 141 after the mounting, the n-bump 141 is preferably placed inside a group of bumps positioned on outmost periphery of the bump array and is more preferably placed at the center of the bump array Second Embodiment Hereinbelow, an LED chip 1c that is an example of semiconductor light emitting device according to a second embodiment of the invention will be described with reference to a schematic bottom view of the LED chip 1c shown in FIG. 7. In the LED chip 1c, as shown in FIG. 7, two bump formation parts 133 are provided on the n-electrode layer 131, and n-bumps 141a, 141b are formed on the two bump formation parts 133, respectively. That is, the only one n-bump 141 is provided on the LED chip 1 of the first embodiment whereas another n-bump is additionally provided on the LED chip 1c of the second embodiment. Other configurations in the LED chip 1c are similar to those in the LED chip 1 of the first embodiment shown in FIG. 1 and FIG. 2, and description thereof is omitted in the following description with the same component members designated by the same reference numerals.

In the LED chip 1c, as shown in FIG. 7, the two n-bumps 141a, 141b and twenty-three p-bumps 142 are placed so as to form a grid-like rectangular matrix having rows and columns each composed of five bumps, in a manner similar to the LED chip 1 of the first embodiment. The one n-bump 141a (which will be referred to as "first n-bump 141a" hereinbelow) is placed at the center of the bump array, and the other n-bump 141b (which will be referred to as "second n-bump 141b" hereinbelow) is placed adjacent to the first n-bump 141a. In other words, the first n-bump 141a and the second n-bump 141b are placed inside a group of bumps positioned on outmost periphery of the bump array (sixteen p-bumps 142 positioned in an area bordered by two-dot chain lines 151, 152 in FIG. 7).

The bump array has four corner parts P1 in positions farthest from its center, and the p-bump 142 is placed in each of the four corner parts P1, as in the bump array in the LED chip 1 of the first embodiment. The n-electrode layer 131 has a reticular strip part 134 that is placed so as to extend from the two bump formation parts 133, through an area between the plurality of p-bumps 142, toward periphery of the n-type semiconductor layer 121.

In the LED chip 1c, the placement of the first n-bump 141a and the second n-bump 141b inside the group of bumps on the outmost periphery of the bump array reduces stresses caused after the mounting in junctions between the circuit board and both the n-bumps 141 and suppresses occurrence of faulty junctions in the first n-bump 141a and the second n-bump 141b after the mounting. Thus reliability of the mounting of the LED chip 1c can be increased by the suppression of the faulty junctions after the mounting in the n-bumps fewer than the p-bumps 142, as in the first embodiment.

On condition that the LED chip 1c undergoes flip-chip mounting on the circuit board, the n-electrode layer 131 of the LED chip 1c and the electrodes on the circuit board are joined to each other through the first n-bump 141a and the second n-bump 141b. Thus reliability of the mounting of the LED chip 1c can further be increased because electrical connection between the n-electrode layer 131 and the circuit board can be maintained even if a faulty junction occurs in the first n-bump 141a or the second n-bump 141b.

In the LED chip 1c, as in the LED chip 1 of the first embodiment, uniformity of distribution of current densities between the n-electrode layer 131 and the p-electrode layers 132 can be improved because the strip part 134 of the n-electrode layer 131 is placed so as to surround part (or all) of areas of the p-electrode layers 132 on which the p-bumps 142 are formed. As a result, uniformity of distribution of light emission intensities between the n-type semiconductor layer 121 and the p-type semiconductor layers 122 (see FIG. 1) can be improved while reliability of the mounting in the LED chip having an increased size is increased.

In the LED chip 1c, either or both of the first n-bump 141a and the second n-bump 141b may be placed in positions except the four corner parts P1 in the outmost periphery of the bump array. Such placement of both the n-bumps in positions that are nearer to the center of the bump array than the p-bumps 142 farthest from the center of the bump array (i.e., four p-bumps 142 placed in the four corner parts P1) reduces the stresses caused in the junctions between both the n-bumps 141 and the circuit board and suppresses occurrence of faulty junction in the first n-bump 141a and the second n-bump 141b after the mounting, in comparison with the placement of the n-bumps in the positions farthest from the center of the bump array (i.e., in the corner parts P1).

Third Embodiment

Hereinbelow, an LED chip 51 that is an example of semiconductor light emitting device according to a third embodiment of the invention will be described with reference to FIG. 8 and FIG. 9. FIG. 9 is a schematic fragmentary bottom view of the LED chip 51 and FIG. 8 is a schematic fragmentary section along line C-C of the LED chip 51 in FIG. 9.

Figure 8:
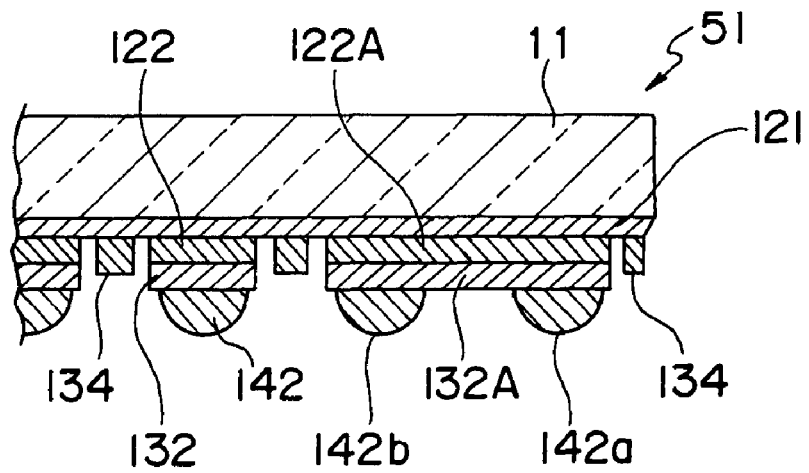
FIG. 8 is a schematic fragmentary section of an LED chip in accordance with a third embodiment of the invention.
Figure 9:
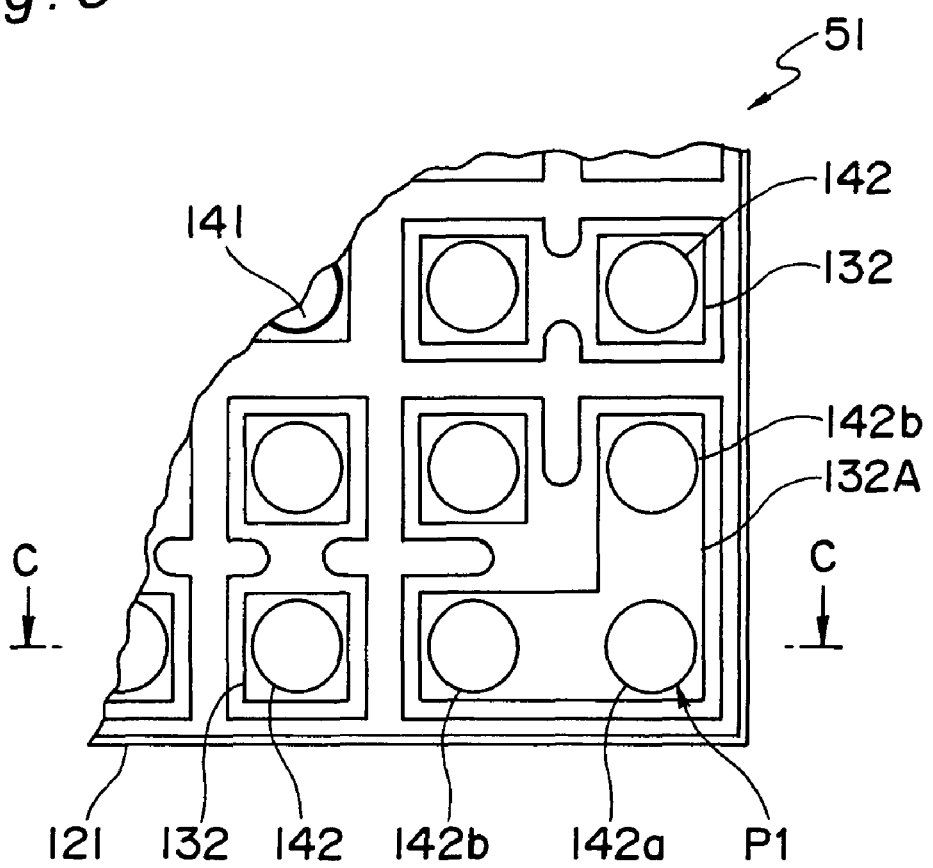
FIG. 9 is a schematic fragmentary bottom view of the LED chip of FIG. 8.
Figure 10:
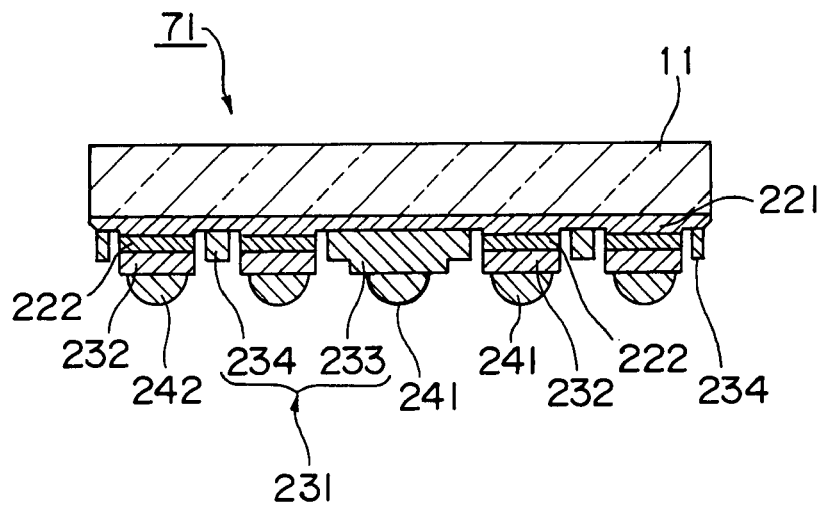
FIG. 10 is a schematic section of an LED chip in accordance with a modification of the first embodiment.
Figure 11A:
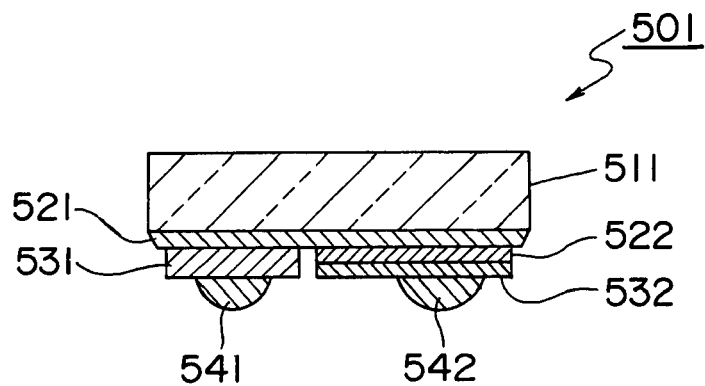
FIG. 11A is a schematic section of a conventional LED chip.
Figure 11B:
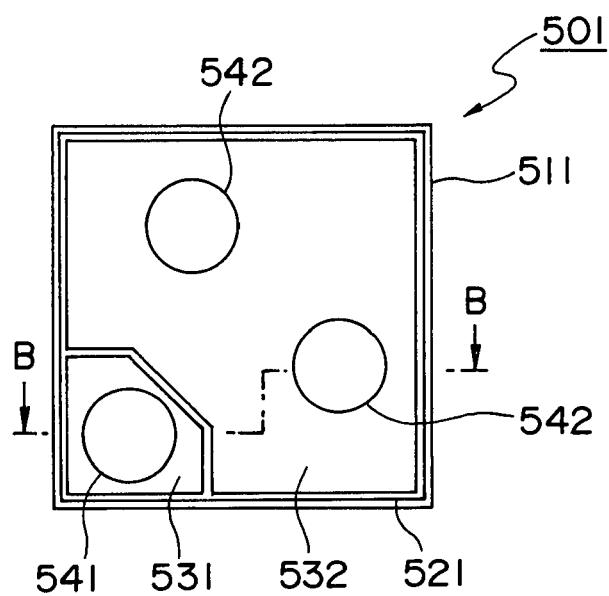
FIG. 11B is a schematic bottom view of the conventional LED chip.

As shown in FIG. 8 and FIG. 9, the LED chip 51 of the third embodiment is different in configuration from the LED chip 1 of the first embodiment in that a p-electrode layer (a corner part p-electrode layer) on which a p-bump 142a in a corner part P1 of a bump array is formed and a p-electrode layer (an adjacent p-electrode layer) on which p-bumps 142b adjacent to the p-bump 142a in the corner part P1 are formed are connected to each other and formed into an integral p-electrode layer 132A. Other configurations are the same as those in the LED chip 1 of the first embodiment, and description thereof is therefore omitted with the same component members designated by the same reference numerals.

In the LED chip 51, as shown in FIG. 9, the p-bump 142a that is placed in the corner part P1 in the LED chip 51 and the two p-bumps 142b that are placed adjacent to and on upside and left sides of the p-bump 142a in the drawing are formed on the common p-electrode layer 132A that is integrally formed so as to be shaped like a letter "L" in plan. Other p-electrode layers 132 are formed so that the bumps individually correspond to the electrode layers in a manner similar to the first embodiment. The L-shaped p-electrode layer 132A is formed on a common p-type semiconductor layer 122A having a similar shape.

Even if a metal junction between the p-bump 142a placed in the corner part P1 and an electrode on a circuit board not shown is broken in the LED chip 51 having such a configuration, for instance, supply of a current to the common p-electrode layer 132A can be backed up by junctions between the adjacent p-bumps 142b and electrodes on the circuit board. Though the p-bump 142a is positively placed at a position having a comparatively high risk of occurrence of faulty junction, i.e., the corner part P1, the supply of the current to the p-electrode layer can reliably be backed up upon occurrence of the faulty junction, so that reliability of the mounting of the LED chip having an increased size can further be improved.

The embodiments of the invention have been described above; however, the invention is not limited to the embodiments and can be modified in various ways.

For instance, three or more n-bumps 141 may be formed on the lower surface of the LED chip according to the above embodiments. However, an excessively large number of n-bumps 141 are not preferable in terms of increase in light emission intensity of the LED chip resulting from increase in junction area between the p-type semiconductor layers 122 and the n-type semiconductor layer 121, and thus the number of the n-bumps 141 is properly determined in terms of increase in light emission intensity and reliability of the LED chip.

On condition that two or more n-bumps 141 are formed, the placement of at least one of the n-bumps 141 in positions that are nearer to the center of the bump array than the p-bumps 142 farthest from the center of the bump array suppresses occurrence of faulty junction in the n-bump(s) 141 after the mounting and improves reliability of the LED chip. Though other n-bump(s) 141 also are preferably placed in positions nearer to the center of the bump array in terms of further improvement in reliability of the LED chip, other n-bump(s) 141 may be placed in positions farthest from the center of the bump array (i.e., corner parts of the bump array) as required for convenience of electrode arrangement on the circuit board or the like.

The n-bumps 141 and the p-bumps 142 do not necessarily have to be rectangularly arranged on the LED chip, and a bump array in other various shapes may be formed on the lower surface of the LED chip. In the bump array having a shape in which corner parts can be identified, the p-bumps 142 are placed in the corner parts and the n-bumps 141 are placed in positions other than the corner parts and nearer to the center of the bump array than the p-bumps 142 farthest from the center of the bump array. In the bump array having a shape in which a group of bumps positioned on outmost periphery thereof can be identified, the n-bumps 141 are preferably placed inside the group of bumps on the outmost periphery and are more preferably placed at the center of the bump array.

Though each of the embodiments described above functions as so-called "blue LED chip" in which the n-type semiconductor layer is formed on the lower surface of the device board and in which the p-type semiconductor layers are formed on areas except specified areas for electrodes on the n-type semiconductor layer, the invention is not limited only to such a structure. For instance, the configuration of the invention can be applied to a structure of so-called "red LED chip." In an LED chip 71 that is an example of semiconductor light emitting device shown in a schematic section of FIG. 10, a p-type semiconductor layer 221 as an example of first semiconductor layer is placed so as to cover a whole lower surface of the chip 71, n-type semiconductor layers 222 as an example of second semiconductor layer are formed on areas except a specified area for electrodes on the p-type semiconductor layer 221, a p-electrode layer 231 as an example of first electrode layer is formed on the electrode area, and n-electrode layers 232 as an example of second electrode layer are formed on the n-type semiconductor layers 222. A p-bump 241 as an example of first bump is formed on a bump formation part 233 of the p-electrode layer 231 and a plurality of n-bumps 242 as an example of second bump are formed on the n-electrode layers 232. In the LED chip 71 having such a configuration, the only one p-bump 241 is placed in a position that is nearer to center of a bump array than n-bumps 242 farthest from the center of the bump array, e.g., at the center of the bump array. Employment of such a configuration of bump placement improves reliability of mounting of a "red LED chip" having an increased size. Component members of the red LED chip are different in material and the like from those of the blue LED chip described above, but sizes and the like of the members can be configured in accordance with similar viewpoints.

It is to be noted that, by properly combining the features of the aforementioned various embodiments, the effects possessed by them can be produced.

The semiconductor light emitting devices of the invention, which concretely improve reliability of mounting thereof and uniformity of distribution of light emission intensities while achieving increase in size thereof, can usefully be applied to equipment in which larger light emission area is required, such as headlight for automobile, LED illumination matching conventional fluorescent lamp, and backlight in large-size liquid crystal device.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2005-206421 filed on Jul. 15, 2005, including specification, drawings, and claims is incorporated herein by reference in its entirety.

The invention claimed is:

1. A semiconductor light emitting device comprising:
an optically transparent device board;
a first semiconductor layer which is formed on the device board so as to cover the device board and which is one of a p-type semiconductor layer and an n-type semiconductor layer;
a first electrode layer formed on the first semiconductor layer;
a second semiconductor layer which is the other of the p-type semiconductor layer and the n-type semiconductor layer, the second semiconductor layer being formed on an area other than where the first electrode layer is formed on the first semiconductor layer, and for emitting light between the first semiconductor layer and the second semiconductor layer;
a second electrode layer formed on the second semiconductor layer;
one first bump formed on the first electrode layer, wherein the first bump is the only bump formed on the first semiconductor layer; and
a plurality of second bumps formed on the second electrode layer,
wherein the first bump and the second bumps are formed in an identical shape and an identical size,
wherein the first bump is arranged with one symmetrical grid array of the second bumps,
wherein the first bump is placed at the center of the one symmetrical grid array, and wherein the first electrode layer forms a cross-shaped area centered in a block of four adjacent second bumps formed on the second electrode layer.

2. A semiconductor light emitting device as defined in claim 1, wherein the second bumps are formed in plurality of rows including an outermost periphery of rows, and
the first bump is placed inside the second bumps disposed in the outermost periphery of the rows.

3. A semiconductor light emitting device as defined in claim 1, further comprising another first bump formed on the first electrode layer,
wherein said another first bump is placed in a position that is nearer to the center of the one symmetrical grid array than the second bumps positioned most distant from the center of the one symmetrical grid array.

4. A semiconductor light emitting device as defined in claim 1, wherein a plurality of the second semiconductor layers independent from one another are formed on the area on the first semiconductor layer other than where the first electrode layer is formed, and
the second electrode layers having the second bumps thereon are respectively formed on the second semiconductor layers.

5. A semiconductor light emitting device as defined in claim 1, wherein the optically transparent device board is generally rectangular, and
wherein the second semiconductor layer and the second electrode layer are arranged such that bumps disposed in corner parts of the one symmetrical grid array are the second bumps.

6. A semiconductor light emitting device as defined in claim 5, further comprising another first bump formed on the first electrode layer,
wherein the one symmetrical grid array has outermost peripheral rows, and
wherein the first bump and said another first bump are disposed inside the outermost peripheral rows of the one symmetrical grid array.

7. A semiconductor light emitting device as defined in claim 5, wherein a plurality of the second electrode layers that individually correspond to the second bumps are formed on the area on the first semiconductor layer other than the area where the first electrode layer is formed, and
the second electrode layers on corner sides on which the second bumps placed in the corner parts are formed are electrically connected to the second electrode layers on adjacent sides on which another set of second bumps adjacent to the second bumps on the corner sides is formed.

8. A semiconductor light emitting device as defined in claim 1, wherein the first electrode layer comprises:
a bump formation part on which the first bump is formed; and
a strip part which extends from the bump formation part, between the second bumps, toward edges of the first semiconductor layer without contacting the second semiconductor layers and the second electrode layers.

9. A semiconductor light emitting device mounted board comprising:
- the semiconductor light emitting device as defined in claim 1; and
- a circuit board on which a first electrode part to be electrically connected to the first bump on the semiconductor light emitting device and a plurality of second electrode parts to be electrically connected to the second bumps are formed and arranged corresponding to the arrangement of the first bump and the plurality of second bumps,
- wherein the semiconductor light emitting device is mounted on the circuit board such the first bump is electrically connected to the first electrode part, the second bumps are electrically connected to the second electrode parts.

10. A semiconductor light emitting device as defined in claim 1, wherein the first semiconductor layer is the p-type semiconductor layer, and the one first bump is the only bump on the device formed on a p-type semiconductor layer.

11. A semiconductor light emitting device as defined in claim 1, wherein the first semiconductor layer is the n-type semiconductor layer, and the one first bump is the only bump on the device formed on an n-type semiconductor layer.

12. A semiconductor light emitting device as defined in claim 1, wherein outermost bumps of the device are connected to the second semiconductor layer, and the second semiconductor layer is the p-type semiconductor layer, and
- wherein the first semiconductor layer is the n-type semiconductor layer.

13. A semiconductor light emitting device as defined in claim 1, wherein outermost bumps of the device are connected to the second semiconductor layer, and the second semiconductor layer is the n-type semiconductor layer, and
- wherein the first semiconductor layer is the p-type semiconductor layer.

* * * * *

UNITED STATES PATENT AND TRADEMARK OFFICE
CERTIFICATE OF CORRECTION

| | | |
|---|---|---|
| PATENT NO. | : 8,129,739 B2 | |
| APPLICATION NO. | : 11/919558 | |
| DATED | : March 6, 2012 | |
| INVENTOR(S) | : Higashi et al. | |

It is certified that error appears in the above-identified patent and that said Letters Patent is hereby corrected as shown below:

On the Title Page

In Item (56) References Cited, under the "FOREIGN PATENT DOCUMENTS" heading, please correct the following reference:

"JP   2001-245480   12/2001" should read --JP   2001-345480   12/2001--.

In the Claims

In column 14, claim 1, line 6, please correct the following error:
"the second bumps," should read --the second bumps, and--;

In column 15, claim 9, line 12, please correct the following error:
"such the first bump is" should read --such that the first bump is--;

In column 15, claim 9, lines 13-14
"the first electrode part, the second bumps" should read --the first electrode part, and the second bumps--.

Signed and Sealed this
Twenty-ninth Day of May, 2012

David J. Kappos
*Director of the United States Patent and Trademark Office*